United States Patent [19]

Nishigaki et al.

[11] 4,363,993

[45] Dec. 14, 1982

[54] PIEZOELECTRIC ELECTRO-MECHANICAL BIMORPH TRANSDUCER

[75] Inventors: Susumu Nishigaki; Kanji Murano; Yoshihisa Watanabe, all of Tokyo, Japan

[73] Assignee: Sony Corporation, Tokyo, Japan

[21] Appl. No.: 213,875

[22] Filed: Dec. 8, 1980

[30] Foreign Application Priority Data

Dec. 12, 1979 [JP] Japan ................ 54/161198
Jan. 10, 1980 [JP] Japan ................ 55/1620

[51] Int. Cl.$^3$ .................................... H01L 41/08
[52] U.S. Cl. ........................ 310/332; 310/346; 310/363
[58] Field of Search ............ 310/330–332, 310/346, 363–366

[56] References Cited

U.S. PATENT DOCUMENTS

| | | | |
|---|---|---|---|
| 3,084,228 | 4/1963 | Shiga | 310/332 X |
| 3,573,511 | 4/1971 | Noren | 310/332 X |
| 3,622,815 | 11/1971 | Schafft | 310/332 |
| 3,629,625 | 12/1971 | Schafft | 310/332 |
| 3,676,722 | 7/1972 | Schafft | 310/332 |

Primary Examiner—Mark O. Budd
Attorney, Agent, or Firm—Hill, Van Santen, Steadman, Chiara & Simpson

[57] ABSTRACT

An electro-mechanical transducer having a first layer made of piezoelectric material having opposing major surfaces, a pair of electrodes formed on the major surfaces of the first layer, respectively, and a second layer clamped at its one surface to one of the surfaces of the first layer. In this case, the first layer has a Young's modulus of E, the second layer has a Young's modulus Ex in one direction and a Young's modulus Ey in the direction perpendicular to the one direction in the major surface, the Young's moduli E, Ex, Ey satisfy the relation E>Ey, Ex>Ey, and one end of the first and second layers along the one direction is clamped. The thickness of the electrode is selected between 0.1 and 3 μm to obtain large amount of displacement at the other end. The outer surface of the electrode may be coated with a conductive paste to ensure voltage supply to the whole surface of the electrode.

6 Claims, 23 Drawing Figures

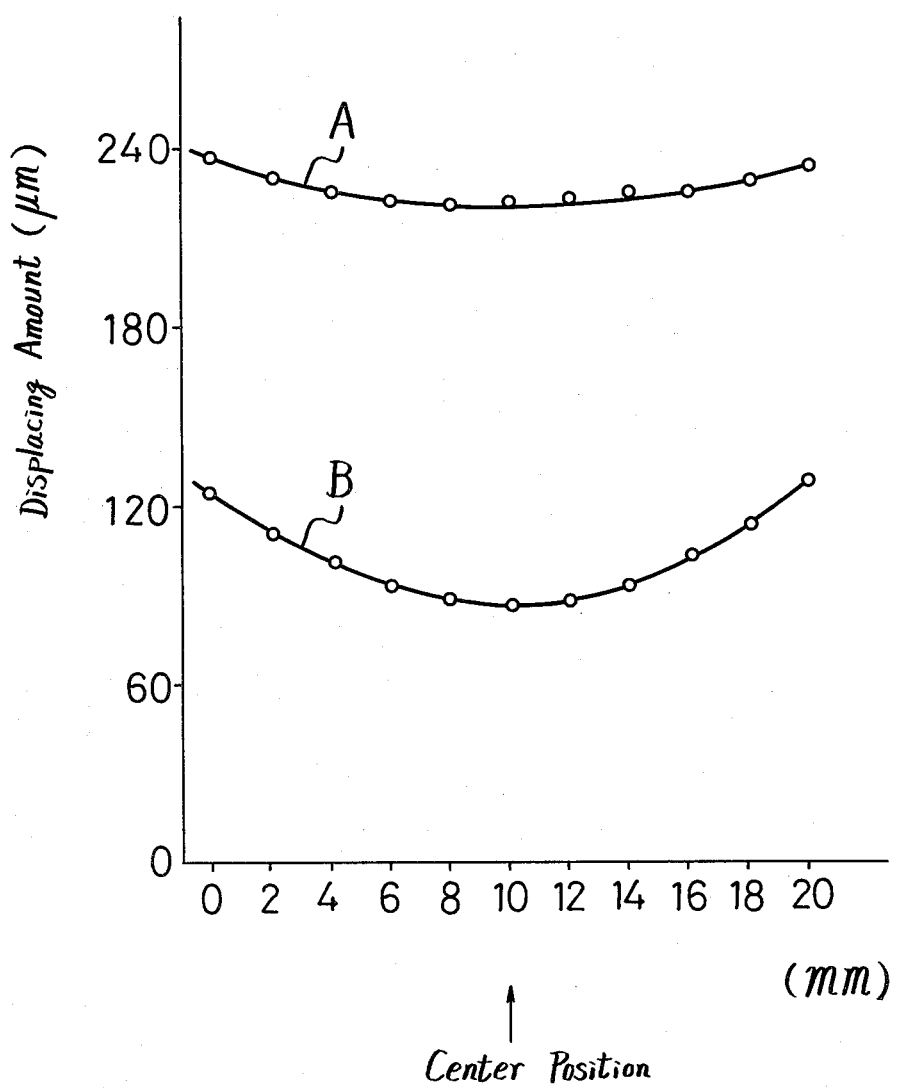

PIEZOELECTRIC ELECTRO-MECHANICAL BIMORPH TRANSDUCER

BACKGROUND OF THE INVENTION

1. Field of the Invention

The present invention generally relates to an electro-mechanical transducer for converting an electrical signal into a mechanical displacement such as a so-called bimorph, and is directed more particularly to an electro-mechanical transducer which is fixed at its one end and carries at its other end a magnetic head and in which a mechanical displacement is generated so as to displace the magnetic head in response to a voltage applied to the transducer.

2. Description of the Prior Art

Recently, in order to increase the record density in a magnetic recording and reproducing apparatus such as a VTR (video tape recorder), such a test to make the width of a record track as narrow as possible has been attempted. In the VTR or the like in which the track width is narrow, the position of a playback or reproducing magnetic head relative to the record track requires higher accuracy. It is rather difficult in technical point of view or requires high cost to present the above positional relation of high accuracy by merely mechanical accuracy. Therefore, in the art an electro-mechanical transducer element is enployed to control the positional relation of the magnetic head to the record track to be always at a predetermined relation. That is, the electro-mechanical transducer element is fixed at its one end to a magnetic head drum and carries a magnetic head coupled to its other end, and an electrical signal, which responds to the variation of a reproduced signal caused by the variation in the positional relation between the magnetic head and record track, is applied to the electro-mechanical transducer element to displace the other end thereof and hence to set the magnetic head to be always at a correct position relative to the record track.

In general, an electro-mechanical transducer element used in the tracking servo of the VTR must be displaced greatly by a low voltage. Especially, in a VTR with a wide track width, the electro-mechanical transducer must be displaced greatly such as for about several hundreds to six hundred micro meters ($\mu$m).

As shown in FIG. 1, a prior art electro-mechanical transducer element consists of two piezoelectric plates 2, each having electrodes 1 coated on its both major surfaces and a plate such as a so-called shim plate 4 located between the piezoelectric plates 2 to be bonded thereto through adhesive agent 3. The piezoelectric plates 2 are each made of piezoelectric material such as ceramic, polymer, complexion of ceramic and polymer or the like, the shim plate 4 is made of metal such as titanium, stainless steel, phosphor bronze or the like, and the adhesive agent 3 is made of a conductive adhesive, respectively.

The piezoelectric plates are polarized to align the polarization in the direction perpendicular to the major surfaces. However, the directions of polarization are opposite with respect to each other in the piezoelectric plates.

When a voltage is applied across the outer electrodes 1 of the piezoelectric plates 2 so as to give them electric fields perpendicular to the major surface, one piezoelectric plate 2 expands while the other piezoelectric plate 2 shrinks, so that the piezoelectric transducer element is displaced. That is, as shown in FIG. 1, when one end of the electro-mechanical transducer element consisting of the laminated piezoelectric plates 2 and shim plate 4 is mechanically fixed or clamped, the other end of the transducer element is displaced as shown by arrows in FIG. 1.

However, the above prior art electro-mechanical transducer element is not displaced as much.

When a given voltage is applied across the electrodes 1 coated on both the major surfaces of piezoelectric plate 2 shown in FIG. 2, the piezoelectric plate 2 is expanded or shrunk in accordance with the direction of the electric field applied thereto. In this case, the expansion and shrinkage are generated with respect to x- and y-directions which are perpendicular with each other. Therefore, when the shim plate 4 made of metal whose modulus of elasticity or Young's modulus is equal with respect to both x- and y-directions or which has isotropy in Young's modulus is bonded to one major surface of the piezoelectric plate 2 to mechanically fix or clamp the same with respect to both x- and y-directions, bendings are generated in the piezoelectric plate 2 in both x- and y-directions, as shown in FIG. 3. Accordingly, if the displacement by the bending in only one direction, for example, x-direction is necessary, the bending in the y-direction rather prevents the bending in the x-direction in view of construction.

Further, in the electro-mechanical transducer element shown in FIG. 1, generally, polymer adhesive agent is used as the adhesive agent 3. In fact, however, the softness of this adhesive agent operates to prevent suitable clamp of the piezoelectric plate 2 and accordingly the generation of bending is suppressed.

Thus, it will be apparent that the prior art electro-mechanical transducer element can not present sufficient displacement.

OBJECTS AND SUMMARY OF THE INVENTION

It is an object of the present invention to provide an improved electro-mechanical transducer.

It is another object of the present invention to provide an electro-mechanical transducer in which one end of the transducer is clamped and represents a large displacement at another end.

It is a further object of the present invention to provide an electro-mechanical transducer suitable for use in tracking servo-mechanism of a magnetic transducer head and magnetic recording medium.

It is a further object of the invention to provide an electro-mechanical transducer which presents a large displacement, is less in secular variation and superior in reliability.

It is a yet further object of the invention to provide an electro-mechanical transducer such as a bimorph element which presents a large displacement, is less in characteristics over a long period of time and hence elongated in use.

It is a still further object of the invention to provide an electro-mechanical transducer which is not affected even when a crack is generated in its electrode during its long use.

The other objects, features and advantages of the present invention will become apparent from the following description taken in conjunction with the accompanying drawings through which the like references designate the same elements.

BRIEF DESCRIPTION OF THE DRAWINGS

FIG. 6 is a graph showing the measured displaced amount of the example shown in FIG. 4;

DESCRIPTION OF THE PREFERRED EMBODIMENTS

The electro-mechanical transducer (element) according to the present invention will be hereinafter described with reference to the attached drawings.

Figure 1:
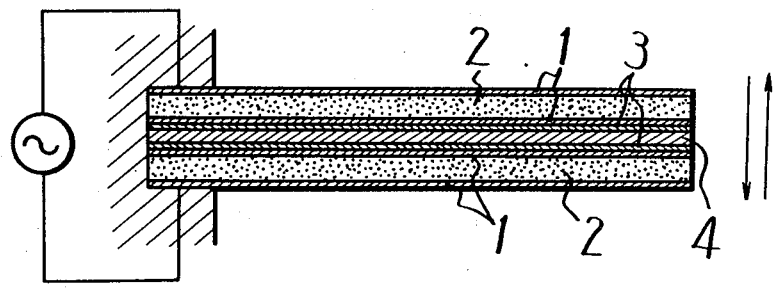
FIG. 1 is a cross-sectional view showing an example of the prior art electro-mechanical transducer.
Figure 2:
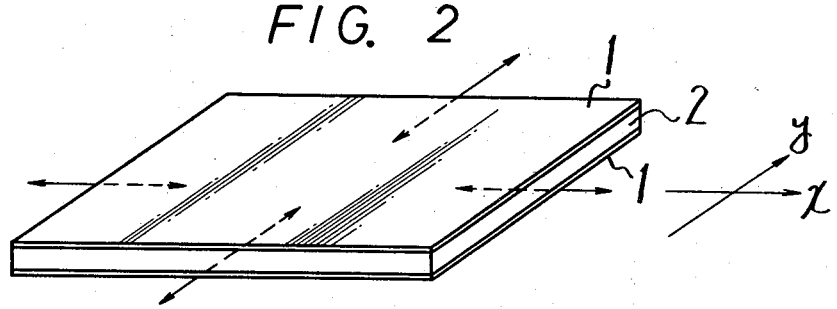
FIGS. 2 and 3 are respectively perspective views used to explain the prior art example shown in FIG. 1.
Figure 3:
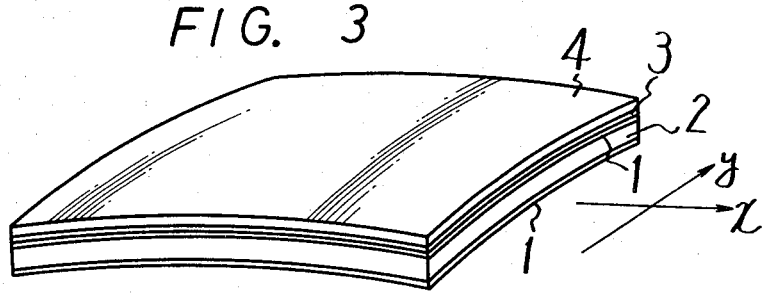
Figure 4:
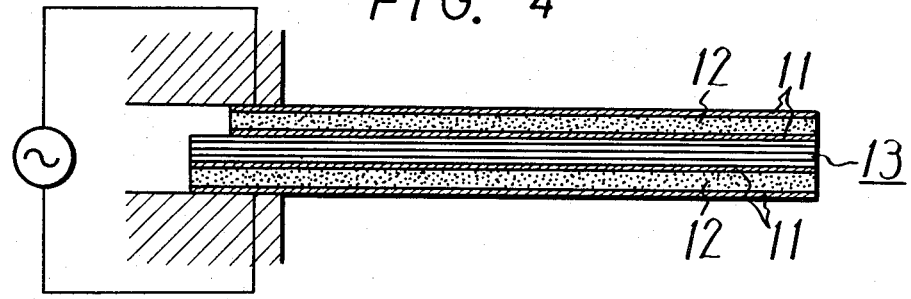
FIG. 4 is a cross-sectional view showing, in an enlarged scale, an example of the electro-mechanical transducer according to the present invention.
Figure 5:
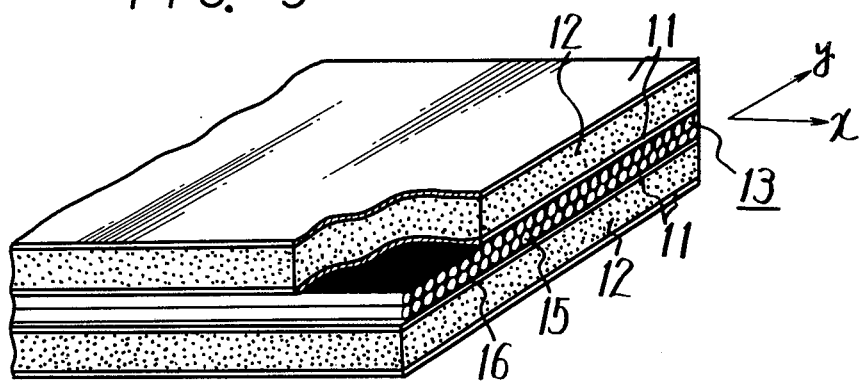
FIG. 5 is an enlarged perspective view showing the essential part of the example of the invention shown in FIG. 4 partially cut away.

An example of the electro-mechanical transducer according to the present invention will be described with reference to FIGS. 4 and 5. In this example, two piezoelectric plates each having electrodes 11 provided on both major surfaces thereof, i.e., first materials or layers 12 are provided, and a second material or layer 13 is interposed between the first layers 12 for the first and second layers to be integrally laminated.

The first layers 12 i.e. piezoelectric plates are each made of a piezoelectric ceramic plate such as lead zironate titanate ceramics. Each of electrodes provided on both major surfaces of piezoelectric ceramic plates is formed by the electroless plating of metals such as nickel Ni, copper Cu and so on, by electroplating of An and or Ag on the electroless plated layer of Ni, Cu and so on so as to lower its electric resistance or present anti corrosion property thereof, or by vaporizing various metals such as Au, Ag, Ni, Cu, Cr and so on. In any case, it is selected that the total thickness of each electrode 11 is 0.1 μm to 3 μm. As the second layer 13, a carbon fiber sheet may be used which is made of, for example, carbon fibers each extended in one direction and adhesives made of epoxy resin into which the carbon fibers are impregnated or immersed. This carbon fiber sheet presents the maximum Young's modulus in the extending direction of the carbon fibers thereof but the minimum Young's modulus in the direction perpendicular to the extending direction of the carbon fibers.

When the carbon fiber sheet is used to form the electro-mechanical transducer element, the carbon fiber sheet is so arranged that the direction along which the carbon fiber sheet presents the maximum Young's modulus or the extending direction of the carbon fibers becomes parallel to the direction along which the electro-mechanical transducer must be expanded or shrunk which pertains to generation of displacement, namely the x-direction in the illustrated example.

An example of the electro-mechanical transducer according to the invention will be described in detail.

Reference Example

As the first layer 12 or piezoelectric plate, a piezoelectric plate consisting of piezoelectric ceramics made of lead zirconate titanate ceramics (PZT) with the thickness of 250 μm is prepared, and then, for example, Au is coated on both major surfaces of the piezoelectric plate 12 by vacuum evaporation to form electrodes 11 on the major surfaces thereof. The piezoelectric plate 12 is subjected to a poling process in the direction perpendicular to the major surface thereof. In this Reference Example, two piezoelectric plates 12 are so subjected to the poling process that the directions of their polarizations are opposite with each other. A number of carbon fibers 15, each having the diameter of 10 μm, are arranged to be extended about in one direction and then immersed or impregnated into adhesive agent 16 made of epoxy resin to form a carbon fiber sheet with a thickness of 100 μm. This carbon fiber sheet is used as a shim plate or second layer 13. That is, the carbon fiber sheet or shim plate 13 is sandwiched between the two piezoelectric plates 12. Under the above state, they are heated and pressed at 120° C. to 130° C. for three hours to harden the adhesive agent 16, from which an electro-mechanical transducer element of 25 mm×25 mm is made. In this case, the extending direction of each of the carbon fibers of the shim plate 13 in the electro-mechanical transducer element is taken as the x-direction, the direction perpendicular to the x-direction and along the major surface of the electro-mechanical transducer element as the y-direction, and the electro-mechanical transducer element is fixed at its one end portion over the width of 5 mm therefrom in the x-direction. Then, the displacing amounts of the electro-mechanical transducer element over the range from the center thereof in the y-direction to the both sides by 10 mm i.e., over a range of 20 mm and in the direction perpendicular to the surface of the electro-mechanical transducer element are measured. The measured result is shown in the graph of FIG. 6 by a curve A. Also, the electro-mechanical transducer element is fixed at its one end portion over the width of 5 mm therefrom in the y-direction. Then, the displacing amounts of the electro-mechanical transducer element over the range from the center thereof in the x-direction to both sides by 10 mm, i.e., range of 20 mm and in the direction perpendicular to the surface of the electro-mechanical transducer element are measured. The measured results are shown in the graph of FIG. 6 by a curve B. In the above measurements, a voltage of 200 volts peak to peak is applied across the outer most electrodes of the electro-mechanical transducer element under the state shown in FIG. 4. As will be apparent from the comparison of the curves A and B, the displaced amount of the electro-mechanical transducer element with its one end along the x-direction being fixed, which is the same extending direction of the carbon fibers, (referred to hereinafter as the displaced amount in the x-direction) is greater than those with its end along the y-direction being fixed (referred to hereinafter as the displaced amount in the y-direction) by about 2.5 times at the central position and about 1.8 times at both end positions. That is, the former represents high sensitivity. The reason of the fact that the displaced amount in the y-direction is lower than that in the x-direction may be considered that since the y-direction of the shim plate 13 is the arranging direction of the carbon fibers 15, the Young's modulus of shim plate 13 in this direction is low with the result that when the expansion and shrinkage are generated in the piezoelectric plates 12 by the piezoelectric effect or electrostrictive effect, the shim plate 13 is somewhat expanded and shrunk in response to the expansion and shrinkage of piezoelectric plates 12 to reduce the clamp effect of the former to the latter, and hence bending is difficult to be generated in the piezoelectric plates 12 in this direction, and accordingly, no great displacement is generated therein. On the contrary, as to the x-direction, this direction is along the longitudinal direction of the carbon fibers in the shim plate 13 and the Young's modulus thereof in this direction is large. Therefore, the clamp effect of shim plate 13 for the piezoelectric plates 12 is large and hence a large displacing amount is obtained. In addition, since the bending of the piezoelectric plates 12 in the y-direction is suppressed as set forth, the bending in the x-direction is generated easily in the piezoelectric plate 12 with the result that the displacing amount thereof becomes large in the x-direction.

Comparing the curves A and B, the displacing amount at the center of curve A is smaller than that of curve B. This reason could be considered that the generation of bendings in the x- and y-directions is apt to be suppressed by the other beings in the y- and x-directions, especially at the center portion thereof, but since the above electro-mechanical transducer element has less being in the y-direction, the bending in the x-direction is generated large even in the center portion which avoids the lowering of displacing amount at the center portion.

Figure 7:
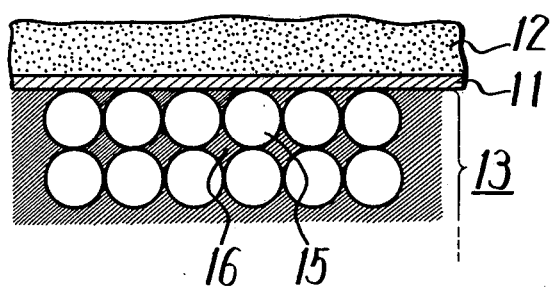
FIG. 7 is a cross-sectional view showing, in an enlarged scale, the essential part of the example of the invention shown in FIG. 5.

The electro-mechanical transducer element, which is provided by interposing between piezoelectric plates 12 the shim plate 13, which is made by immersing a number of fibers such as carbon fibers 15 into adhesive agent 16, and hardening and pressing then integral as the above example, has such construction that the fibers 15 are bonded by the adhesive agent 16 as shown in FIG. 7. In this case, since the fibers 15 are bonded to be almost in direct contact with the electrode 11 of piezoelectric element 12, therebetween presented is almost no or very thin layer of adhesive agent 16 which is rich in elasticity and apt to be displaced. Therefore, it can be avoided that the clamp effect of the shim plate 13 for the piezoelectric plate 12 is reduced by the adhesive agent 16.

Terminals can be led out from the inner electrode 11 of each of the first materials or layers, i.e., piezoelectric plates 12 by such a manner that a conductive layer such as metal foil or evaporated metal layer is coated on an end portion of the second material or shim plate 13 at the fixed side of electro-mechanical transducer element to be in contact with electrode 11 thereof and then a terminal is led out from the conductive layer, or though not shown a recess or cut-out is formed on a part of the shim plate 13 to partially expose the inner electrodes 11 of the piezoelectric plates 12 from which terminals are led out.

In order to clarify the feature of the present invention, a comparison example will be now described.

COMPARISON EXAMPLE 1

Figure 8:
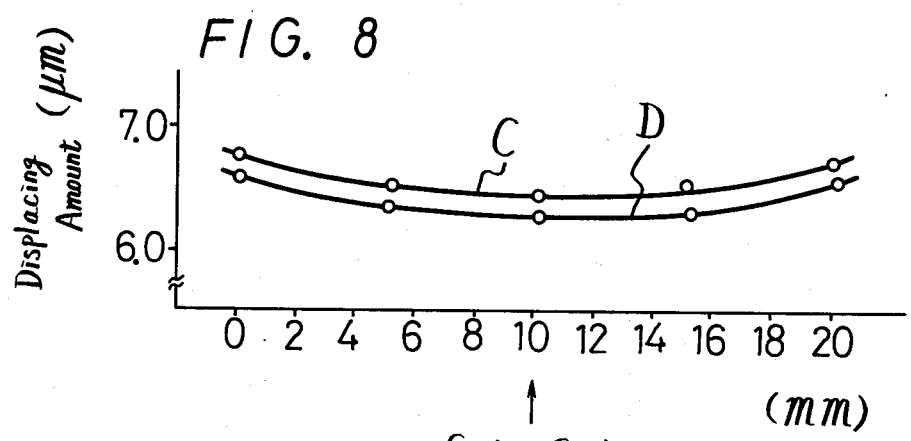
FIG. 8 is a graph showing the measured displaced amount of a comparison example with the invention.

An electro-mechanical transducer is formed of so-called polymeric piezoelectric plates each made of a complex material of poly fluorinated vinylidene and power of piezoelectric ceramics which is used as the piezoelectric plate 12 in the electro-mechanical transducer element explained in the reference example. In this case, a shim plate substantially the same as that 13 used in the reference example is used. The displacing amounts of comparison example 1 in the x- and y-directions are respectively measured by the same manner as that of the reference example. The measured results are respectively shown by curves C and D in the graph of FIG. 8. As will be apparent from the curves C and D there is almost no difference between the displacing amounts in the x- and y-directions. In other words, according to the comparison example 1, even though such a shim plate is used which has anisotropy in Young's modulus or whose Young's modulus in the x-direction is higher than that in the y-direction similar to the reference example, there is generated no difference between the displacing amounts in the x- and y-directions. This explanation can be considered that, in this comparison example 1, the piezoelectric plates of the electro-mechanical transducer element are each made of the polymeric piezoelectric plate whose Young's modulus is smaller than the smaller Young's modulus of the shim plate in the y-direction and hence the clamp effect is too large. At this point, exists the reason of the present invention why the Young's modulus E of piezoelectric plate 12 (first material or layer) is selected higher than the Young's modulus $E_y$ of the shim plate 13 (second material or layer) in the y-direction.

Incidentally, the Young's modulus of the piezoelectric ceramics used in the reference example is $5 \sim 10 \times 10^5$ kg/cm$^2$, for example, $7 \times 10^5$ kg/cm$^2$, the Young's modulus of the carbon fiber sheet in the fiber direction is $13.5 \times 10^5$ kg/cm$^2$, its Young's modulus in the direction perpendicular to the fiber direction is $1.0 \times 10^5$ kg/cm$^2$, and the Young's modulus of the polymeric piezoelectric plate used in the comparison example 1 is $2.6 \times 10^4$ kg/cm$^2$. Further, the Young's modulus of Ti used in a prior art seam plate is $10 \times 10^5$ kg/cm$^2$.

Figure 9:
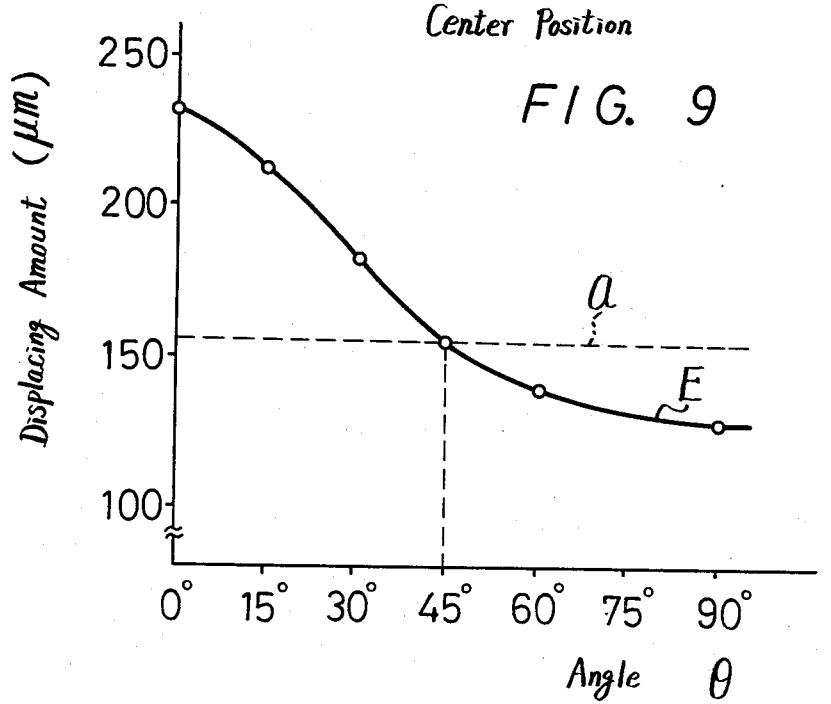
FIG. 9 is a graph showing the measured result of the relation between displaced amount of a second material and the direction of its fibers of a second material.

In the reference example, the shim plate 13 is so arranged that it has the maximum Young's modulus in the x-direction and the minimum Young's modulus in the y-direction. It is, however, possible that a certain angle is provided between the extending direction of the fibers in the shim plate 13 and the x-direction without coinciding both directions. When in the reference example an angle θ between the extending direction of the carbon fibers in the shim plate 13 and the x-direction is changed 5° by 5° from 0° and the displacing amount of the electro-mechanical transducer element in the x-direction is measured, the result shown by a curve E in the graph of FIG. 9 is obtained. In the graph of FIG. 9, the displacing amount indicated by a broken line a is the value of the case where a metal plate is used as a shim plate of an electro-mechanical transducer element as in the prior art. This value of the displacing amount approximately corresponds to the case where the angle θ is selected as 45°. In other words, when the angle θ is selected smaller than 45°, anisotropy appears in the Young's modulus of the shim plate and the sensitivity is improved thereby.

By the way, the following table 1 shows the measured Young's modulus Ex of the shim plate 13 made of a carbon fiber sheet and used in the reference example in the x-direction and the ratio between the Young's moduli Ex and Ey by changing the angle θ.

TABLE 1

| Angle θ | Ex (Kg/cm$^2$) | Ex/Ey |
| --- | --- | --- |
| 0° | 13.5 × 10$^5$ | 13.5 |
| 15° | 10.35 × 10$^5$ | 9 |
| 30° | 6.12 × 10$^5$ | 4.5 |
| 45° | 2.7 × 10$^5$ | 1 |
| 60° | 1.35 × 10$^5$ | 0.22 |
| 75° | 1.15 × 10$^5$ | 0.11 |
| 90° | 1.0 × 10$^5$ | 0.07 |

Figure 10:
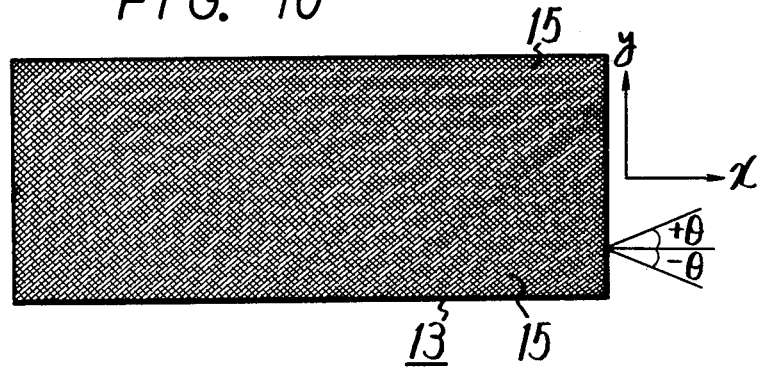
FIG. 10 is an enlarged plan view of another example of a second material used in the invention.

Further, when a sheet made of arranged fibers such as when carbon fibers are used as the second layer 13 which has anisotropy in Young's modulus as described above, there is no need for the extending direction of the fibers to be limited in one direction with the angle θ of 0° to 45°. It is of course possible that, for example, as shown in FIG. 10 by thin lines, a sheet made of fibers 15 such as carbon fibers arranged with the angle +θ to the x-direction and a sheet made of fibers 15 such as carbon fibers arranged with the angle −θ to the x-direction are integrally laminated or made integral to be the second layer 13.

In some cases, it is possible that a sheet made of similar fibers arranged with the angle θ of 90° (not shown) is interposed between the two sheets to be integrated therewith as a unitary member.

As described above, according to the invention, the thickness of each of the electrode plates provided on the piezoelectric plates 12 is selected as 0.1 μm to 3 μm. Now, the thickness of the electrode 11 will be considered.

EXAMPLE 1

Figure 11:
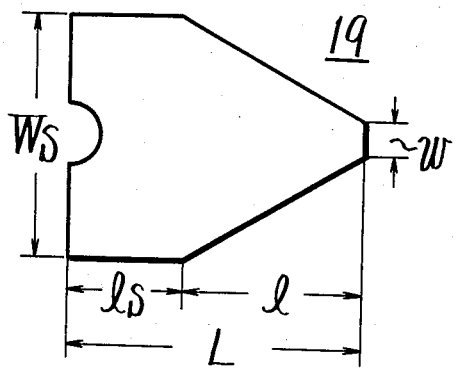
FIG. 11 is a top plan view of a bimorph element or electro-mechanical transducer according to an example of the invention.
Figure 12:
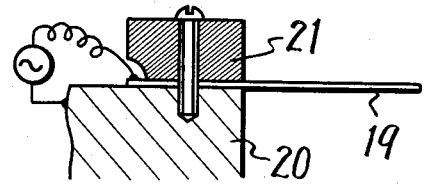
FIG. 12 is a cross-sectional side view showing the bimorph of FIG. 11 supported at its one end by a fixed base.

Two piezoelectric plates are prepared each of which is formed of lead zirconate titanate ceramic having a thickness of 200 μm, Ni is electroless plated on all of both major surfaces of each piezoelectric plate with the thickness of 1 μm, and then Au is electroplated on the Ni layer with the thickness of 0.1 μm to thereby form the electrode 11. Between the both piezoelectric plates, sandwiched is such material that carbon fibers are impregnated into adhesive agent made of epoxy resin with the thickness of 170 μm, and then they are heated and pressed to thereby provide a bimorph 19 shown in FIG. 11. As shown in the figure, the bimorph 19 has a length L, which is along the extending direction of the carbon fibers, selected as 27 mm, one side end portion fixed on a fixed base 20 by a holder 21 at a length ls of 9 mm in the extending direction of the carbon fibers as shown in FIG. 12, and other side or free portion at a length l of 18 mm movable. The width $W_s$ of the bimorph 19 in the direction perpendicular to the extending direction of the carbon fibers on the fixed side is selected as 26 mm, and the free portion of bimorph 19 has such a shape that it is gradually narrowed as it reach the free end and the width w of its free end is selected as 4 mm as shown in FIG. 11. Five samples having the above construction are made. These samples are numbered as specimens 1 to 5.

COMPARISON EXAMPLE 2

In the piezoelectric plate having the same construction as that of Example 1, the electrode is made by baking silver point to have the thickness of 8 μm. Five samples of the above construction are made and numbered as specimens 6 to 10.

The measured results of the amount of displacement at the free end of the bimorphs of the specimen 1 to 10 when the peak to peak voltage $V_{pp}$ of 200 V(volts) and the frequency of 600 Hz is applied to each of the specimen is shown in the following Table 2.

TABLE 2

| Example 1 | | Comparison Example 2 | |
| --- | --- | --- | --- |
| Specimen No. | Vibration (μm) | Specimen No. | Vibration (μm) |
| 1 | 650 | 6 | 484 |
| 2 | 714 | 7 | 477 |
| 3 | 644 | 8 | 472 |
| 4 | 656 | 9 | 460 |
| 5 | 711 | 10 | 484 |
| Average $\bar{x}$ | 677 | Average $\bar{x}$ | 475 |

From the above Table 2, it will be apparent that the bimorphs according to the present invention can present large displacement as compared with those of the comparison examples, and hence if the shim plate having anisotropy in Young's Modulus is employed, large displacement can be obtained. In this case, it is noted that the electrodes affect them much.

Figure 13:
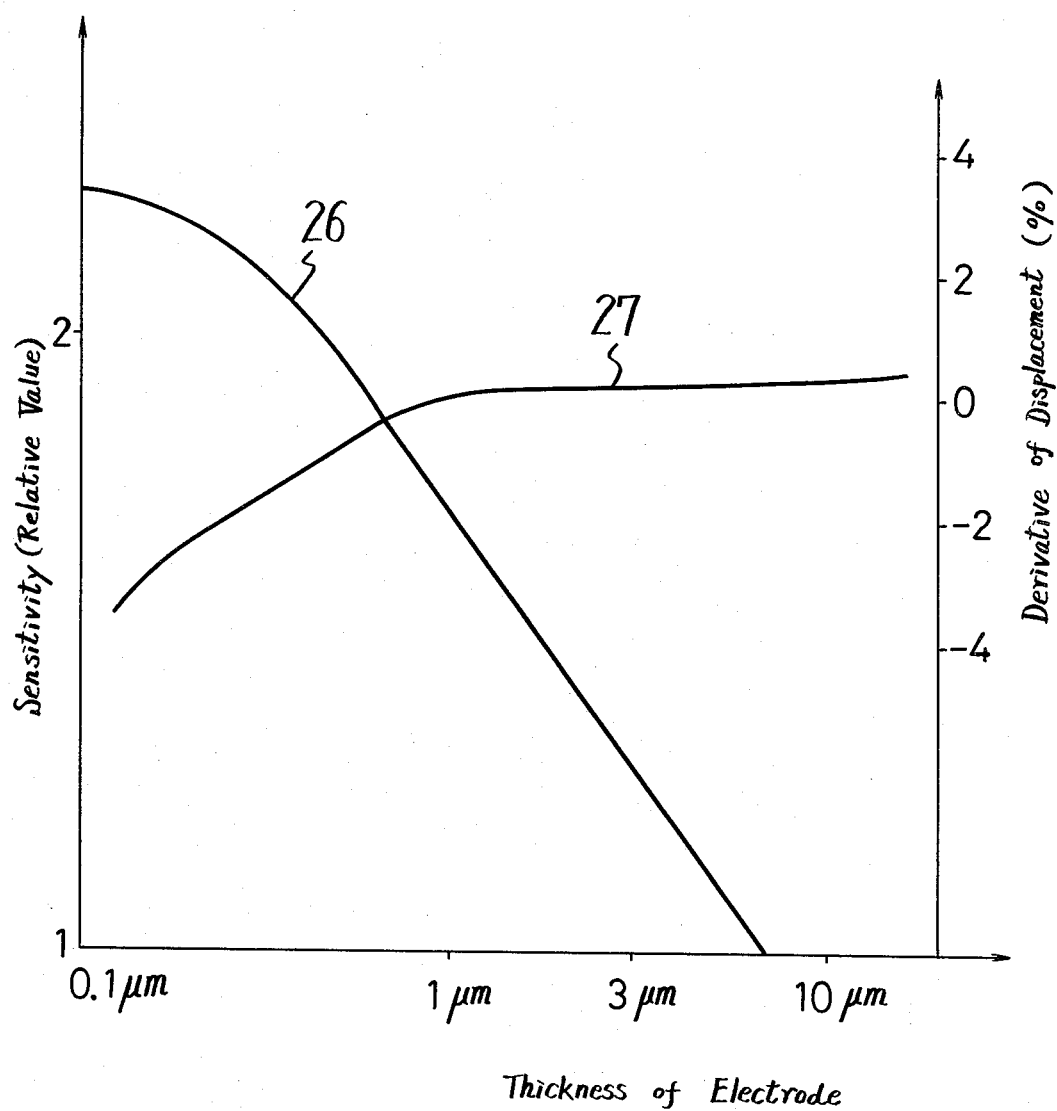
FIG. 13 is a graph showing the relation among the thickness of an electrode, sensitivity and derivative of displacement of the bimorph shown in FIG. 11.

FIG. 13 is a graph showing the relation between the thickness of the electrode and displacement amount of the bimorph, where the value is shown as a relative value to the displacement amount of the prior art bimorph provided with electrodes having 8 μm thickness. In the graph of FIG. 13, a curve 26 shows such a case that the electrode of the bimorph of Example 1 is made of Ni electroless plating, and a curve 27 shows a case that such a voltage (frequency 60 Hz) having the peak to peak displacement of 500 μm is applied to the bimorph and it is continuously operated in 500 hours. It will be apparent from the curves 26 and 27 that as the thickness of the electrode 11 becomes large, the sensitivity (displacement amount) becomes low, which could be considered by the fact that as the electrode 11 becomes large in thickness, the expansion and shrinkage of the piezoelectric plate is suppressed by the clamp of the electrode, and that as the thickness of the electrode becomes small, especially is smaller than 0.1 μm, the deviation of the displacing amount is remarkable, which may be caused by the fact that when the piezoelectric plate is repeatedly bent to cause much fatigue in its electrodes and necessary voltage can not be applied to the peizoelectric plate all over its area. Therefore, the thickness of the electrode is selected smaller than 3 μm so as to obtain the sensitivity sufficiently higher than that of the prior art and more than 0.1 μm so as to lower the derivative of the displacement amount. The above is the reason why the thickness of the electrode is specified.

As described above, according to the bimorph of the invention, a large displacing amount can be presented, so that the bimorph of the invention is suitable, for example, as tracking servo for the magnetic head of the VTR and it becomes possible that the bimorph can be driven by a low voltage for obtaining the displacing amount same as that of the prior art.

Further, when as the second material i.e. shim plate such a sheet which is made by immersing fibers such as carbon fibers into adhesive agent is used as in the above example, the step to apply adhesives to the bimorph, as required in the prior art, becomes unnecessary. Therefore, the process therefor can be simplified and hence the bimorph can be made at low cost.

Further, according to the invention, the displacement in the y-direction which has no contribution to obtain the necessary displacement is suppressed, so that even when the bimorph is displaced much or large amplitude, the generation of cracks can be avoided.

Now, a second example of the invention will be described. In the second example, two piezoelectric plates i.e. first materials 12, each of which has the electrodes 11 provided on its both major surfaces, are provided and the second material 13 is located between the two first materials 12 to integrate the same. In this example, especially on the electrodes 11 provided on the major surfaces of both piezoelectric plates 12 opposite the major surfaces contact with the second material 13 i.e. outer major surfaces, coated is such an electrically conductive resin layer 14 which is made by coating a paint, in which electrically conductive powder such as Ag powder of 70 to 90 parts by weight is dispersed in 30 to 10 parts by weight of resinous binding agent such as epoxy resin phenolic resin and hardening the point with thickness of, desirably 5 to 50 $\mu$m to make a bimorph 15. This bimorph is fixed at its one side to the fixed base 20. The above cited layer may be coated on all over the outer electrode 11 but on such an area including the boundary position between the fixed portion and movable portion of the bimorph i.e. the fixed end and the portion near it.

EXAMPLE 2

Figure 14:
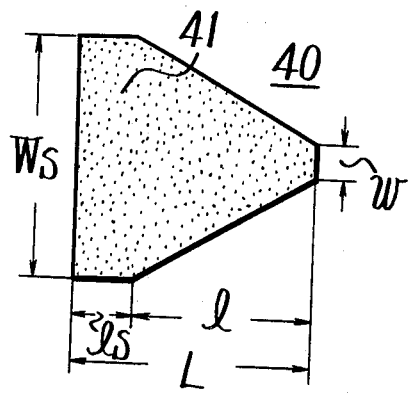
FIGS. 14 and 15 are top plan views respectively showing other examples of the bimorph of the invention.

Similar to the Example 1, as the first material i.e. piezoelectric plate, a piezoelectric plate of piezoelectric ceramics made of lead zirconate titanate with the thickness of 200 $\mu$m and the electrode 11 is formed on both major surfaces of the piezoelectric plate by electroless plating Ni with the thickness of 1 $\mu$m and then electroplating Au with the thickness of 0.1 $\mu$m thereon. While, carbon fibers, each having the diameter of 10 $\mu$m, are arranged to be extended along substantially one direction and then they are immersed into adhesive agent of epoxy resin to provide a carbon fiber sheet with the thickness of 170 $\mu$m. This carbon fiber sheet thus provided is sandwiched between two of the above piezoelectric plates as a shim plate. Under the above state, they are heated and pressed at 120° to 130° C. in three hours to harden the adhesive agent. Thus, a bimorph element of 25 mm×25 mm is prepared. Then, a paint, in which Ag powder of 80 parts by weight is dispersed into 20 parts by weight of phenolic resin hardenable at low temperature is coated on the electrode 11 of the outer surface of each of both piezoelectric plates of the bimorph element and is heated at 100° to 200° C., for example, 130° to be hardened or cured to thereby form an electrically conductive resin layer. The bimorph thus made is worked to have such a shape that Ws=26 mm, ls=7 mm, l=20 mm and w=3 mm as shown in FIG. 14, in which 40 generally designates the above bimorph, 41 an electrically conductive layer and reference letters same as those of FIG. 11 designate the same elements and parts.

EXAMPLE 3

Figure 15:
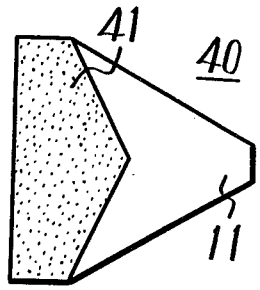

A bimorph similar to that 40 of Example 2 is prepared. In this example, however, as shown in FIG. 15, the electrically conductive layer 41 is partially formed on the portion near the fixed portion of the bimorph 40.

EXAMPLE 4

A bimorph which is the same as that 40 of Example 2 except that conductive layer 41 is not formed in this Example 4.

Figure 16:
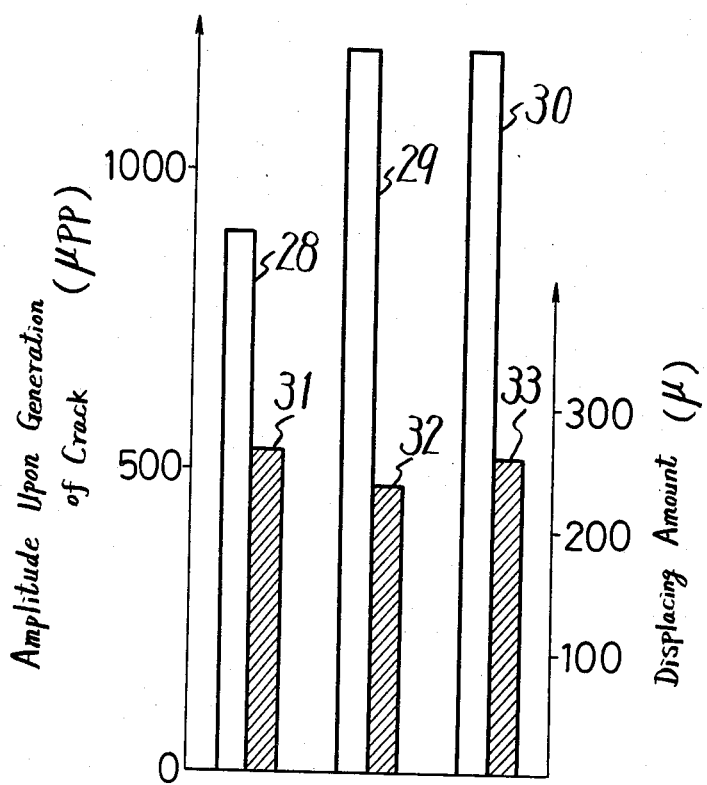
FIG. 16 is a graph showing the amplitude of displacement of the bimorphs when a crack is generated in the electrodes thereof and the sensitivity thereof.

In the graph of FIG. 16, shown is the measured results of the peak to peak amplitudes (displacing amounts) of the bimorphs of Examples 2, 3 and 4 at which a crack appears in the electrode 11 by rods 29, 30 and 28, respectively. From the graph of FIG. 16 it will be apparent that the bimorphs 40 according to Examples 2 and 3 the invention require large amplitude for a crack to appear in the electrode 11 as compared with the bimorph with no conductive layer 41. In other words, the present invention can effectively avoid generation of cracks in the electrode 11 even for large displacing amount and hence elongates life span of the bimorph.

When a peak to peak voltage $V_{pp}$ of 150 volts is applied to each of the bimorphs of Examples 2, 3 and 4, the measured displaced amounts thereof are shown in the graph of FIG. 16 by rods with hatches 31, 32 and 33, respectively, from which it will be understood that the displaced amounts and sensitivities of the bimorphs are approximately same through Examples 2, 3 and 4 which in turn means that the provision of the conductive layer 41 has almost no affect on the sensitivity of the bimorph. This reason is that the conductive layer 41 has elasticity and hence almost no influence on the displacing amount of the bimorph. However, if the conductive thin layer 41 is too thick, it will affect the sensitivity of the bimorph, while if it is too thin, its effect will disappear. For this reason, it was ascertained that it is sufficient that the thickness of the thin conductive layer 41 is selected as 5 $\mu$m to 50 $\mu$m.

Figure 17:
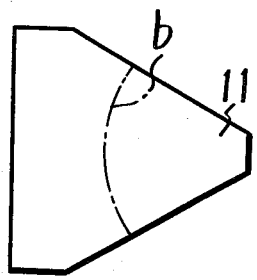
FIG. 17 is a top plan view of a comparison example where a crack is generated in its electrode.

In the bimorph of the Example 4, the crack is generated in the electrode 11 in the biased state near the fixed portion of the movable portion as shown in FIG. 17 by a one-dot chain line b.

Figure 18A:
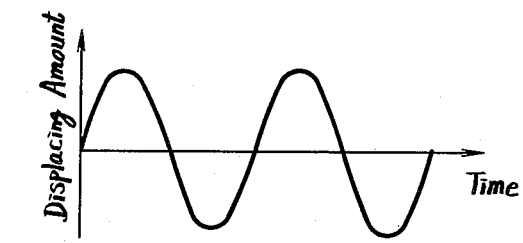
FIGS. 18A, 18B and FIGS. 19A, 19B are respectively displacement waveform diagrams of the bimorphs.
Figure 18B:
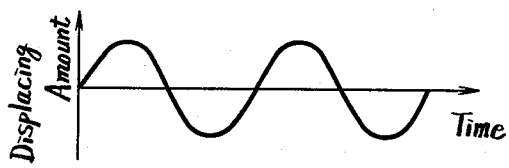
Figure 19A:
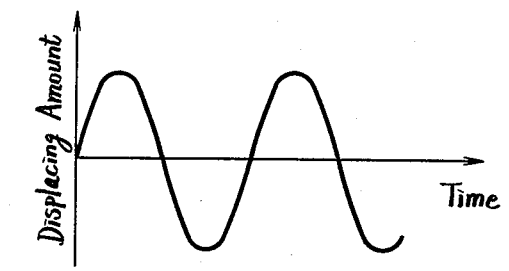
Figure 19B:
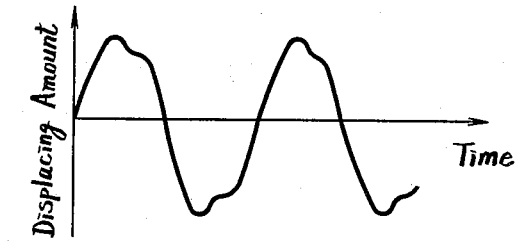

The displacing waveform of the bimorph of the Example 4 having no crack is shown in FIG. 18A, while the displacing waveform of the same bimorph, after a crack is generated therein, becomes reduced in the amplitude of its displacement for the same signal or same in voltage and frequency as shown in FIG. 18B. On the contrary, in the bimorph 40 according to the Example 2 of this invention, there is almost no amplitude change in the displacing waveform but there is caused little distortion therein for the same signal between no crack and crack generated in the bimorph or its electrode as shown in FIGS. 19A and 19B. The reason may be considered that even when a crack is generated, a predetermined signal voltage can be applied to the respective parts of the bimorph due to the existence of the thin resin layer 41 which has the electrical conductivity is relative rich in elasticity and bridges the crack.

Figure 20:
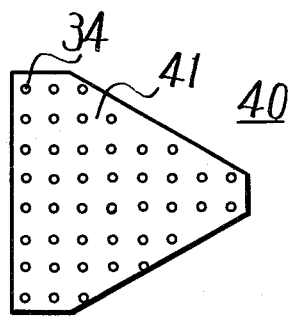
FIGS. 20 and 21 are top plan views of other examples of the bimorph according to the invention.
Figure 21:
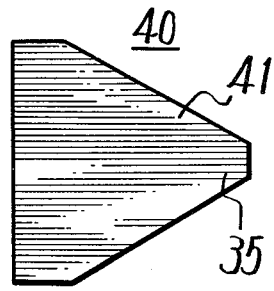

The coating pattern of the conductive layer 41 can be selected as desirably. For example, as shown in FIG. 20, a number of apertures 34 are formed through the layer 41, or as shown in FIG. 21, the layer 41 is formed of a number of stripes 35 each extending from the fixed end to the free end of the bimorph 40.

As described above, according to the present invention, by the provision of the electrically conductive resin layer 41, the generation of cracks in the electrodes 11 coated on both outer surfaces of the bimorph can be effectively avoided even when the bimorph is displaced much or the electrodes 11 are displaced much by the large displacement of the bimorph, and also it can be suppressed that the characteristic of the bimorph is varied and hence the bimorph can not be used practically even if a crack is generated.

Since in the present invention the conductive resin layer 41 coated on the surface of the bimorph causes almost no lowering of the sensitivity when its thickness is 5 to 50 μm but affects the sensitivity little, it is possible that the sensitivity is adjusted by selecting the thickness of the layer 41 within the above range.

As described above, according to the present invention, since the electro-mechanical transducer element, which can generate a large displacement, is made, the electro-mechanical transducer element of the invention is suitable to be used as the tracking servo for the magnetic head in, for example, a VTR and can be driven by a relatively low voltage for the same amount of displacement.

Further, when a sheet made of fibers such as carbon fibers immersed into adhesive agent is used as the second layer, i.e., shim plate, there is no need to especially coat adhesive agent on the shim plate as in the prior art. Therefore, manufacturing process becomes simple, and accordingly, the electro-mechanical transducer can be manufactured inexpensively.

Also, the displacement of the electro-mechanical transducer element in the y-direction, which has no direct relation to generate the displacement, is suppressed in the invention, so that it can be avoided that a crack or the like is generated in the electro-mechanical transducer element upon its maximum amplitude operation.

In the above description, the invention is applied to the electro-mechanical transducer element which consists mainly of laminated two piezoelectric plates, but it will be apparent that the invention can be applied to various types of electro-mechanical transducer elements with the same effects.

It will be apparent that many modifications and variations could be effected by one skilled in the art without departing from the spirit or scope of the novel concepts of the present invention, so that the spirit or scope of the invention should be determined by the appended claims.

We claim as our invention:

1. An electro-mechanical transducer comprising:
   (a) a first layer made of piezoelectric material having opposing major surfaces;
   (b) a pair of electrodes formed on said major surfaces, respectively; and
   (c) a second layer comprising a plurality of fibers whose surface is clamped to one of said surfaces of said first layer; said first layer having a Young's modulus of E, said second layer having a Young's modulus Ex in one direction x, and a Young's modulus Ey in a direction y perpendicular to said one direction in said major surface, said Young's moduli E, Ex, Ey satisfying the relation $E > Ey$, $Ex > Ey$, and one end of said layers being clamped along one edge so that its opposite edge is free to move and said x and y directions lying in the plane of said second layer and each of said pair of electrodes having thicknesses in the range of 0.1 μm to 3 μm.

2. An electro-mechanical transducer according to claim 1, in which each of said pair of electrodes is formed of electroless plated nickel.

3. An electro-mechanical transducer according to claim 1, in which each of said pair of electrodes is formed of electroless plated nickel and a gold layer provided thereon.

4. An electro-mechanical transducer according to claim 1 further comprising an electrically conductive resin coating layer provided on an outer surface of each of said pair of electrodes.

5. An electro-mechanical transducer according to claim 4, in which said coating layer has a thickness between 5 and 50 μm.

6. An electro-mechanical transducer according to claim 4, in which said coating layer is composed of electrically conductive powder and resinous binder which is cureable at a temperature below 200° C.

* * * * *